United States Patent [19]

Frueh et al.

[11] Patent Number: 4,833,590
[45] Date of Patent: May 23, 1989

[54] METHOD AND APPARATUS FOR THE FINE ADJUSTMENT OF AN OBJECT ON A SUB-SURFACE OF A PLANE

[75] Inventors: Walter Frueh; Hans-Juergen Schnorrenberg, both of Munich, Fed. Rep. of Germany

[73] Assignee: Siemens Aktiengesellschaft, Berlin and Munich, Fed. Rep. of Germany

[21] Appl. No.: 68,364

[22] Filed: Jul. 1, 1987

[30] Foreign Application Priority Data

Jul. 15, 1986 [DE] Fed. Rep. of Germany ....... 3623884

[51] Int. Cl.$^4$ ..................... G06F 15/20; G01R 15/12
[52] U.S. Cl. .......................... 364/167.01; 324/73 PC; 324/158 P; 324/158 F; 356/399; 364/490
[58] Field of Search ................... 364/167, 488–491, 364/559, 487; 318/640; 356/399, 400, 401, 318, 331; 414/909; 324/73 AT, 73 PC, 158 P, 158 F

[56] References Cited

U.S. PATENT DOCUMENTS

| | | | |
|---|---|---|---|
| 3,670,153 | 6/1972 | Rempert et al. | 364/491 X |
| 3,909,602 | 9/1975 | Micka | 364/490 |
| 4,092,593 | 5/1978 | Wolk | 324/73 PC X |
| 4,484,121 | 11/1984 | Chambron | 318/640 |
| 4,618,934 | 10/1986 | Nagase | 364/490 X |
| 4,625,164 | 11/1986 | Golder et al. | 324/158 F |

Primary Examiner—Joseph Ruggiero
Attorney, Agent, or Firm—Hill, Van Santen, Steadman & Simpson

[57] ABSTRACT

A method and apparatus for the fine adjustment of an object on a sub-surface of a plane by means of a remotely operable holding mechanism based on the principle of reflection sensing. The fine adjustment of the object, such as a tool or test probe, on a printed circuit board is utilized in the framework of the precision necessary for etching and forming bores in the printed circuit board.

11 Claims, 1 Drawing Sheet

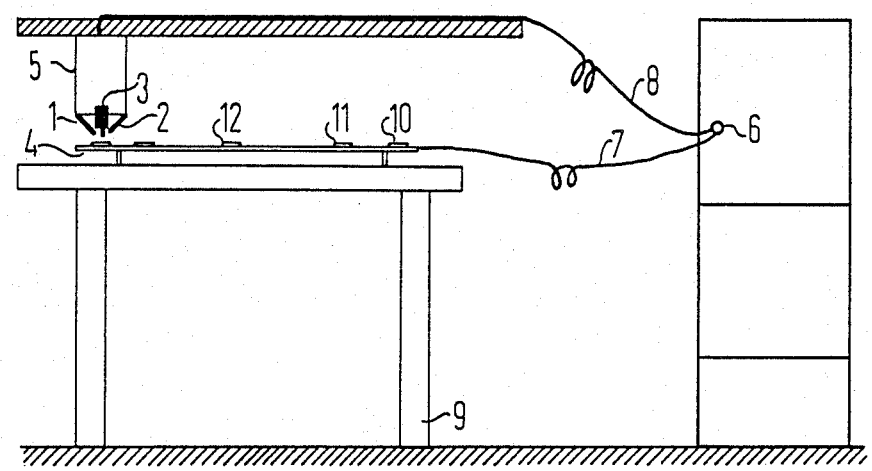

4,833,590

METHOD AND APPARATUS FOR THE FINE ADJUSTMENT OF AN OBJECT ON A SUB-SURFACE OF A PLANE

BACKGROUND OF THE INVENTION

This invention relates generally to a method and apparatus for the fine adjustment of an object on a sub-surface of a plane by means of a remotely operable holding mechanism, and in particular, to a method and apparatus for finely adjusting a test probe over a printed circuit board.

Due to the increasing miniaturization in electronic assemblies, a greater need for mechanisms which can provide fine adjustments has arisen in order to be able to execute precise positioning functions on the assemblies. Such mechanisms have applicability in the area of printed circuit board development, especially where the printed circuit boards are developed essentially with automatic layout systems. All data that completely describes a printed circuit board is stored in the files of the layout system. This information is utilized in present adjustment systems. Included among this information is data concerning the interconnect pattern, the bores on the printed circuit board, the equipping of the board, and etching and soldering tolerances. Positioning tasks exists not only in printed circuit board development, but also in the testing of electronic assemblies. In the testing of electronic assemblies, test probes must be positioned over the printed circuit board in order to subsequently contact internal points on the assembly.

It is known that previous adjustment systems work with multi-stage adjustment. The mechanical rough adjustment is undertaken in the first stage and a fine adjustment is undertaken in the second stage. The adjustment procedure is observed via a microscope or via a video means. The adjustment procedure is implemented with the assistance of remotely operable holding mechanisms which are referred to as manipulators.

Such a method of fine adjustment is largely inaccessible to automation, since a human operator undertakes the evaluation with respect to the fine adjustment with the assistance of the microscope or video means.

The present invention overcomes this drawback in the prior art and provides for a more fully automated system.

SUMMARY OF THE INVENTION

The present invention involves positioning objects quickly and automatically on prescribed sub-surfaces or points of a plane with the assistance of a remotely operable holding mechanism. This object is achieved in that at least one transmitter beams electromagnetic waves onto the plane and at least one receiver receives the waves reflected at the plane. These waves which are reflected are interpreted and the fine adjustment of the object is executed depending on the interpretation.

Due to the demand for fast, automatic positioning and due to the increasingly high number of prescribed surfaces or points, the interpretations are carried out in a data processing system. In the data processing system, the received, reflected waves are compared to stored information about the plane. A difference signal is calculated therefrom and the object is finely adjusted in response to this difference signal via the remotely operable holding mechanism.

In order to achieve a high sensitivity in the apparatus for the implementation of such a method, the transmitter first has a monochromatic light source and the receiver is tuned to the wavelength of the monochromatic light of the transmitter; second the monochromatic light source has a wavelength that has greatly differing reflection and absorption behavior for materials on the plane.

In layout development or in testing of electronic assemblies, the plane is a printed circuit board and the materials on the printed circuit board are copper, epoxy and soldering tin. The object is the testing probe and the sub-surface is a sensing point. The transmitter and receiver form a sensing pair and the apparatus may have a plurality of sensing pairs which may form a matrix in the center of which the test probe is located.

The advantages obtainable with the method and apparatus of the present invention are universally employable. The apparatus is not limited merely to printed circuit boards on which positioning is carried out. It can likewise be applied to VLSI development and to large arrangements of a type usual in mechanics. The precision of the positioning is dependent only on the precision of the optical definition of the positioning point on the printed circuit board. Since the object-proximal parts of the apparatus such as, for instance, transmission and reception diodes are small and can be connected to the rest of the apparatus via highly flexible optical fiber bundles, the object-proximal parts can be integrated into the greatest variety of arrangements, for example, in cooling plates.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing and in which:

The single FIGURE is a side view of the apparatus utilizing the method of the present invention.

DESCRIPTION OF THE PREFERRED EMBODIMENT

The present invention has general applicability but is preferably utilized for the layout development and testing of printed circuit boards.

As shown in the FIGURE a remotely operable holding mechanism 5 is used to move the object-proximal parts, such as transmitter 1, receiver 2, and test probe 3 over the printed circuit board 4. The printed circuit board 4 is placed on the coordinate table 9 and carries various assemblies or materials 10, 11 and 12. The printed circuit board 4, the object-proximal parts 1, 2 and 3 and the remotely operable holding mechanism 5 are connected to a data processing system 6 via connecting lines 7 and 8. The assemblies 10, 11 and 12 on the printed circuit board 4 are supplied with the needed supply voltage and with appropriate test signals via the connecting line 7 and a first output signal is measured therefrom. Given a faultless measured value, the next output signal is measured until all measured values have been registered. Given a faulty measured value, an error diagnostic program in the data processing system 6 indicates the coordinates of the point to be contacted on the printed circuit board 4.

A rough adjustment of the sensing head 3 based on the coordinates of the error diagnostic program is carried out with the remotely operable holding mechanism 5. The reflected electromagnetic waves beamed from the transmitter 1 are picked up in the receiver 2 and a scanned image is produced. A comparison between the stored information in the data processing system 6 regarding the point to be contacted and the scanned image point is performed. Given a deviation between the scanned image and the stored information, the fine adjustment of the sensing head is carried out by the remotely operable holding mechanism 5. The fine adjustment is concluded when the scanned image agrees with the stored information. After the contacted point is measured with the test probe 3, the next coordinate point specified by the error diagnostic program is identified, finely adjusted and measured. This procedure is repeated until the error has been found.

Thus, in general terms, the method for the fine adjustment of an object by means of a remotely operable holding mechanism on a substrate of a plane comprises the steps of beaming electromagnetic waves onto the plane by at least one transmitter; receiving waves reflected at the plane by at least one receiver; interpreting the reflected waves; and executing fine adjustment of the object dependent on the interpreting. The interpreting of the reflected waves is performed in a data processing system and comprises the further steps of comparing the received reflected waves to stored information about the plane; calculating a difference signal therefrom; and finely adjusting the object via a remotely operable holding mechanism with the difference signal.

Also in general terms, the apparatus for implementing the above described method for the fine adjustment of an object by means of a remotely operable holding mechanism on a sub-surface of the plane comprises at least one transmitter which has a monochromatic light source for beaming monochromatic light onto the plane. The monochromatic light has a wavelength that has greatly differing reflection in absorption characteristics for materials on the plane. At least one receiver is tuned to the wavelength of the monochromatic light and receives the reflected light from the plane. The receiver outputs a data signal representative of the reflected light. A data processing system receives the data signal for interpreting the reflected light and calculates a control signal therefrom. The remotely operable holding mechanism finely adjusts the object in response to the control signal.

In one embodiment, the plane is a printed circuit board and the materials on the printed circuit board may be copper, epoxy or soldering tin. The object is a test probe and the sub-surface is a sensing point. The transmitter and receiver may form a sensing pair and the apparatus may have a plurality of sensing pairs built up to form a matrix in the center of which the test probe is arranged.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter of the above depiction shall be interpreted as illustrative and not in a limiting sense.

What is claimed is:

1. A method for the fine adjustment of an object by means of a remotely operable holding mechanism on a sub-surface of a plane, comprising:

beaming monochromatic light onto the plane by at least one transmitter, said monochromatic light having a wavelength that has greatly differing reflection and absorption characteristics for materials on said plane;

receiving waves reflected at the plane by at least one receiver, said receiver tuned to said wavelength of said monochromatic light;

interpreting the reflected waves; and executing fine adjustment of the object dependent on said interpreting.

2. The method according to claim 1, wherein interpreting the reflected waves is performed in a data processing system and said method comprises the further steps of:

comparing the received reflected waves to stored information about said plane;

calculating a difference signal therefrom;

finely adjusting said object via a remotely operable holding mechanism with said difference signal.

3. An apparatus for the fine adjustment of an object by means of a remotely operable holding mechanism on a sub-surface of a plane, comprising:

at least one transmitter having a monochromatic light source for beaming said monochromatic light onto the plane;

at least one receiver tuned to a wavelength of said monochromatic light of said transmitter for receiving light reflected at the plane; and data processing system for interpreting said light received by said receiver to calculate a signal therefrom, said remotely operable holding mechanism finely adjusting said object in response to said signal.

4. The apparatus according to claim 3, wherein said monochromatic light source has a wavelength that has greatly differing reflection and absorption behavior on materials of said plane.

5. The apparatus according to claim 4, wherein said plane is a printed circuit board and said materials on said printed circuit board are copper, epoxy or soldering tin.

6. The apparatus according to claim 4, wherein said object is a test probe and said sub-surface is a sensing point, said transmitter and said receiver forming a sensing pair, said apparatus having a plurality of sensing pairs built up to form a matrix in the center of which said test probe is arranged.

7. An apparatus for the fine adjustment of an object by means of a remotely operable holding mechanism on a sub-surface of a plane, comprising:

at least one transmitter having a monochromatic light source for beaming said monochromatic light onto the plane, said monochromatic light having a wavelength that has greatly differing reflection and absorption characteristics for materials on said plane;

at least one receiver tuned to said wavelength of said monochromatic light for receiving reflected light from said plane, said receiver outputting a data signal representative of said reflected light;

data processing system receiving said data signal for interpreting said reflected light and calculating a control signal therefrom, said remotely operable holding mechanism finely adjusting said object in response to said control signal.

8. An apparatus according to claim 7, wherein said plane is a printed circuit board and at least one of said material on said printed circuit board is copper.

9. An apparatus according to claim 7, wherein said plane is a printed circuit board and at least one of said material on said printed circuit board is epoxy.

10. An apparatus according to claim 7, wherein said plane is a printed circuit board and at least one of said materials on said printed circuit board is soldering tin.

11. The apparatus according to claim 7, wherein said object is a test probe and said sub-surface is a sensing point, said transmitter and said receiver forming a sensing pair, said apparatus having a plurality of sensing pairs built up to form a matrix in the center of which said test probe is arranged.

* * * * *